(12) United States Patent
Lee et al.

(10) Patent No.: US 11,934,737 B2
(45) Date of Patent: Mar. 19, 2024

(54) SMART BACKGROUND NOISE ESTIMATOR

(71) Applicant: Google LLC, Mountain View, CA (US)

(72) Inventors: Jae Lee, Palo Alto, CA (US); Manas Maheshwari, San Jose, CA (US)

(73) Assignee: Google LLC, Mountain View, CA (US)

( * ) Notice: Subject to any disclaimer, the term of this patent is extended or adjusted under 35 U.S.C. 154(b) by 422 days.

(21) Appl. No.: 17/282,234

(22) PCT Filed: Jun. 23, 2020

(86) PCT No.: PCT/US2020/039104
§ 371 (c)(1),
(2) Date: Apr. 1, 2021

(87) PCT Pub. No.: WO2021/262151
PCT Pub. Date: Dec. 30, 2021

(65) Prior Publication Data
US 2022/0035593 A1 Feb. 3, 2022

(51) Int. Cl.
*G06F 3/16* (2006.01)
*H04R 1/10* (2006.01)

(52) U.S. Cl.
CPC ............ *G06F 3/165* (2013.01); *H04R 1/1041* (2013.01)

(58) Field of Classification Search
CPC ........... G06F 3/16; G06F 3/162; H04R 25/70; H04R 25/505
(Continued)

(56) References Cited

U.S. PATENT DOCUMENTS

| 6,674,865 B1* | 1/2004 | Venkatesh | H04R 3/02 381/86 |
| 2003/0026437 A1* | 2/2003 | Janse | H04R 3/005 381/71.7 |

(Continued)

FOREIGN PATENT DOCUMENTS

| EP | 1232496 A1 | 8/2002 |
| JP | 2013106197 A | 5/2013 |

OTHER PUBLICATIONS

International Search Report and Written Opinion for International Application No. PCT/US2020/039104 dated Apr. 28, 2021. 22 pages.
(Continued)

*Primary Examiner* — Alexander Krzystan
(74) *Attorney, Agent, or Firm* — Colby Nipper PLLC (57) ABSTRACT

The present disclosure provides systems and methods for applying a volume gain to change the playback volume of a device by calculating a smoothed noise estimate. The smoothed noise estimate may calculated using an exponential smoothing method. The exponential smoothing method may include applying a weight factor to both a background noise estimate and a historical smoothed noise estimate. The weight factor may place more emphasis on either the background noise estimate or the historical smoothed noise estimate depending on the value of the weight factor. The value of the weight factor may change based on the type of environment the device is in, the speed of the background noise transitions, and/or historical data. The calculated smoothed noise estimate may be used to calculate a volume gain. The volume gain may be applied over a period of time such that the playback volume of the device changes smoothly.

20 Claims, 5 Drawing Sheets

(58) Field of Classification Search
USPC .................... 381/320, 321, 106, 109; 700/94
See application file for complete search history.

(56) References Cited

U.S. PATENT DOCUMENTS

| | | |
|---|---|---|
| 2005/0063552 A1 | 3/2005 | Shuttleworth et al. |
| 2009/0010442 A1 | 1/2009 | Usher et al. |
| 2009/0304191 A1 | 12/2009 | Hoang Co Thuy et al. |
| 2014/0188466 A1 | 7/2014 | LeBlanc et al. |
| 2015/0243272 A1 | 8/2015 | Ozluturk |
| 2019/0214036 A1* | 7/2019 | Wurtz ................. G10L 21/0208 |
| 2019/0272835 A1* | 9/2019 | Adami ................. G10L 21/028 |
| 2019/0272836 A1* | 9/2019 | Adami ................. G10L 21/0232 |
| 2019/0394576 A1* | 12/2019 | Petersen ............. H04R 25/453 |

OTHER PUBLICATIONS

Invitation to Pay Additional Fees for International Patent Application No. PCT/US2020/039104 dated Mar. 5, 2021. 14 pages.
"International Preliminary Report on Patentability", Application No. PCT/US2020/039104, dated Dec. 13, 2022, 13 pages.

* cited by examiner

SMART BACKGROUND NOISE ESTIMATOR

CROSS REFERENCE TO RELATED APPLICATIONS

The present application is a national phase entry under 35 U.S.C. § 371 of International Application No. PCT/US2020/039104, filed Jun. 23, 2020, the entire disclosure of which is incorporated by reference herein.

BACKGROUND

Electronic devices capable of outputting content may determine a background noise level and adjust a playback volume accordingly. The playback volume may be adjusted quickly, such that the user notices a sudden or drastic change in the playback volume which may be troubling, uncomfortable, or embarrassing. In some cases, the background noise level may not be sustained, such as the sudden noise of a door slamming Therefore, the adjustment to a playback volume may be unnecessary and the resulting playback volume may be inappropriate.

BRIEF SUMMARY

The present disclosure provides systems and methods for adjusting a playback volume based on a smoothed background noise level. For example, a device may include one or more microphones and one or more processors in communication with the one or more microphones. The one or more microphones may be configured to determine a background noise level, smooth the background noise level by applying a weight factor to the determined background noise level, calculate, based on the smoothed noise level, a volume gain, compare the calculated volume gain to a threshold gain, and apply the calculated volume gain to increase or decrease a playback volume of the device when the calculated volume gain is less than the threshold gain. When the calculated volume gain is equal to the threshold gain, the one or more processors may be configured to re-smooth the background noise level.

The weight factor may correspond to a change in intensity of background noise. The weight factor may be larger for a transition from a first background noise level to a second background noise level than a second transition from a third background noise level to a fourth background noise level, the first transition being quicker than the second transition.

Smoothing the determined background noise may further include applying the weight factor to a second smoothed noise level. The smoothed noise level may be calculated at a first time and the second smoothed noise level may be calculated at a second time, the second time occurring before the first time.

The one or more processors may be further configured to receive an input for adjusting the playback volume, wherein the input differs from the calculated volume gain, and adjust the playback volume based on the received input. Applying the volume gain may occur over a period of time such that the playback volume gradually increases or decreases. The one or more processors may be further configured to receive content such that smoothing the determined background noise level and calculating the volume gain occurs when the one or more processors are receiving the content.

Another aspect of the disclosure includes a method for adjusting a playback volume based on a smoothed background noise level. The method includes determining, using one or more processors, a background noise level, smoothing, using the one or more processors, the determined background noise level by applying a weight factor to the determined background noise level, calculating, using the one or more processors based on the smoothed noise level, a volume gain, and applying, using the one or more processors, the calculated volume gain to increase or decrease a playback volume of a device when the calculated volume gain is less than the threshold gain.

Yet another aspect of the disclosure provides for a non-transitory computer-readable medium storing instructions, which when executed by one or more processors, cause the processors to determine a background noise level, smooth the background noise level by applying a weight factor to the determined background noise level, calculate, based on the smoothed noise level, a volume gain, compare the calculated volume gain to a threshold gain, and apply the calculated volume gain to increase or decrease a playback volume of a device when the calculated volume gain is less than the threshold gain.

DETAILED DESCRIPTION

Electronic devices capable of outputting content may include an option to smooth the estimated background noise to more smoothly adjust a playback volume. For example, the electronic device may include microphones or other sensors for detecting background noise. Using the detected background noise, the device may determine a background noise level. However, instead of just relying on an instantaneous measurement of the background noise level, the device may look to historic noise level data to determine a smoothed background noise level or smoothed noise estimate.

The smoothed noise estimate may be determined by using an exponential smoothing method. For example, the smoothed noise estimate may be determined by applying a weight factor to the current background noise measurement as well as a to historic smoothed noise estimates. Thus, the smoothed noise estimate may be based on both present and historical data such that the device builds a memory system of noise levels in the past to determine how to change the playback volume in the future. In particular, the smoothed noise estimate may rely on a weight factor that is based on how quickly or slowly the background noise changes. In examples where there is a sudden and sustained increase or decrease in the background noise, the weight factor may be larger such that newer background noise measurements are weighted more than the historic background noise levels. In examples where there is a slow or gradual increase or decrease in the background noise, the weighted factor may be smaller such that historic background noise levels are weighted more than the current background noise measurements.

Once the background noise level is smoothed, a volume gain may be calculated. The volume gain may be the amount in decibels ("dB") in which the playback volume may be increased or decreased. According to some examples, the volume gain may be compared to a threshold gain. If the volume gain is less than the threshold gain, the playback volume may be increased or decreased. If the volume gain is equal to or greater than the threshold gain, the volume gain may not be applied. Instead, the device may reach a maxed state. When the device is in the maxed state, the device may re-smooth the background noise level and/or recalculate the smoothed noise estimate until the background noise level changes such that a newly calculated volume gain is less than the threshold gain. The volume gain may be applied over a period of time. In instances where the background noise transitions quickly, the volume gain may be applied over a short period of time. In examples where the background noise transitions slowly, the volume gain may applied over a longer period of time.

Adjusting a transition period for the volume gain based on a transition time for the background noise may provide for a smoother transition in playback volume. For example, as the background noise level is smoothed, an increase or decrease in playback volume may happen gradually as the volume gain may be based on both historic background noise levels as well as the current background noise level. Thus, a slamming door, a clap of thunder, a lull in conversation, a dropped book, etc. may not have a large impact on the playback volume. This may result in a more user friendly experience. For example, if a user is in a quiet environment, a sudden increase in the playback volume due to a door slamming may be both embarrassing and painful. If a user transitions from a quiet environment to a loud environment, the playback volume may increase accordingly without receiving user input. In such an example, the user may not have to provide an input to the device to increase the volume. Instead, the device may automatically apply a volume gain based on the calculated smoothed noise estimate. The change in volume may enable the user to not miss any content due to the playback volume automatically increasing.

Figure 1:
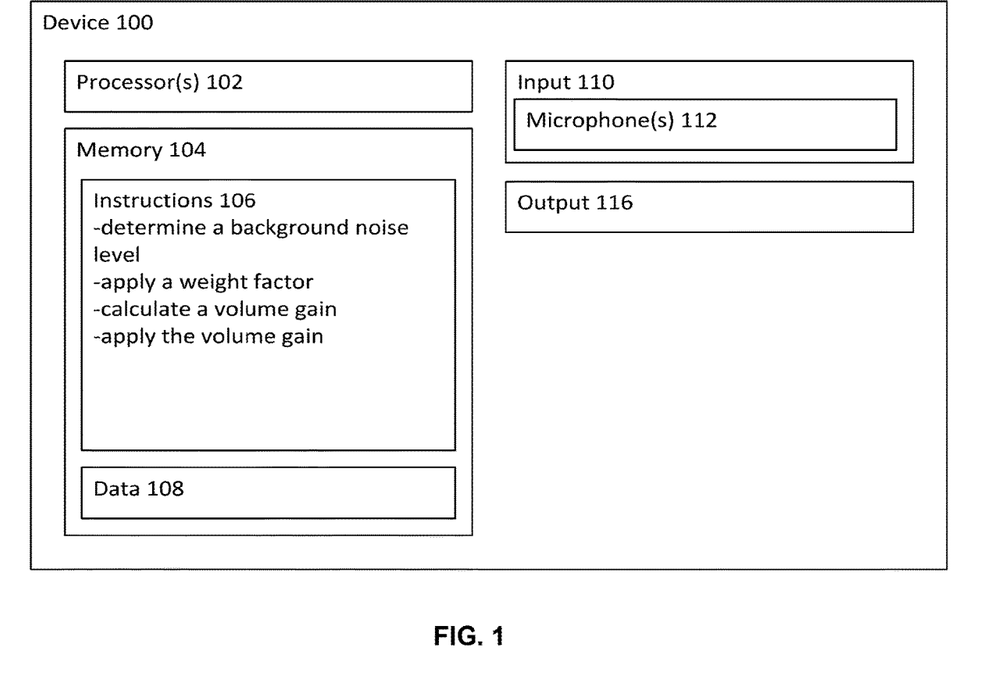
FIG. 1 is a block diagram illustrating an example device according to aspects of the disclosure.

FIG. 1 provides an example block diagram illustrating components of a device 100. As shown, the device 100 includes various components, such as one or more processors 102, memory 104, and other components typically present in microprocessors, general purpose computers, or the like. Device 100 may also include input 110 and an output 116. Input 110 may include one or more microphones 112.

The one or more processors 102 may be any conventional processors, such as commercially available microprocessors. Alternatively, the one or more processors may be a dedicated device such as an application specific integrated circuit (ASIC) or other hardware-based processor. Although FIG. 1 functionally illustrates the processor, memory, and other elements of device 100 as being within the same block, it will be understood by those of ordinary skill in the art that the processor, computing device, or memory may actually include multiple processors, computing devices, or memories that may or may not be stored within the same physical housing. Accordingly, references to a processor or computing device will be understood to include references to a collection of processors or computing devices or memories that may or may not operate in parallel.

Memory 104 may store information that is accessible by the processors 102, including instructions 106 that may be executed by the processors 102, and data 108. The memory 104 may be of a type of memory operative to store information accessible by the processors 102, including a non-transitory computer-readable medium, or other medium that stores data that may be read with the aid of an electronic device, such as a hard-drive, memory card, read-only memory ("ROM"), random access memory ("RAM"), optical disks, as well as other write-capable and read-only memories. The subject matter disclosed herein may include different combinations of the foregoing, whereby different portions of the instructions 106 and data 108 are stored on different types of media.

Data 108 may be retrieved, stored or modified by processors 102 in accordance with the instructions 106. For instance, although the present disclosure is not limited by a particular data structure, the data 108 may be stored in computer registers, in a relational database as a table having a plurality of different fields and records, XML documents, or flat files. The data 108 may also be formatted in a computer-readable format such as, but not limited to, binary values, ASCII or Unicode. By further way of example only, the data 108 may be stored as bitmaps comprised of pixels that are stored in compressed or uncompressed, or various image formats (e.g., JPEG), vector-based formats (e.g., SVG) or computer instructions for drawing graphics. Moreover, the data 108 may comprise information sufficient to identify the relevant information, such as numbers, descriptive text, proprietary codes, pointers, references to data stored in other memories (including other network locations) or information that is used by a function to calculate the relevant data.

The instructions 106 can be any set of instructions to be executed directly, such as machine code, or indirectly, such as scripts, by the processor 102. In that regard, the terms "instructions," "application," "steps," and "programs" can be used interchangeably herein. The instructions can be stored in object code format for direct processing by the processor, or in any other computing device language including scripts or collections of independent source code modules that are interpreted on demand or compiled in advance. Functions, methods and routines of the instructions are explained in more detail below.

The device 100 may further include an input 110 for receiving volume adjustment commands. The input 110 may be, for example, a touch sensor or one or more microphones 112. The device 100 may also include an output 116. The output 116 may be, for example, a speaker.

Device 100 may have one or more microphones 112 in a variety of locations. For example, the one or more microphones 112 may be located such that it can determine a playback volume. According to some embodiments, there may be one or more microphones 112 located on the outer or inner surface of device 100. The one or more microphone 112 may be able to detect background noise. The one or more microphone 112 may also be able to detect sound to be processed by the one or more processors within device 100 and transmit the sound to another device.

It should be understood that the device 100 may include other components which are not shown, such as a battery, charging input for the battery, signals processing components, etc. Such components may also be utilized in execution of the instructions 106.

Figure 2:
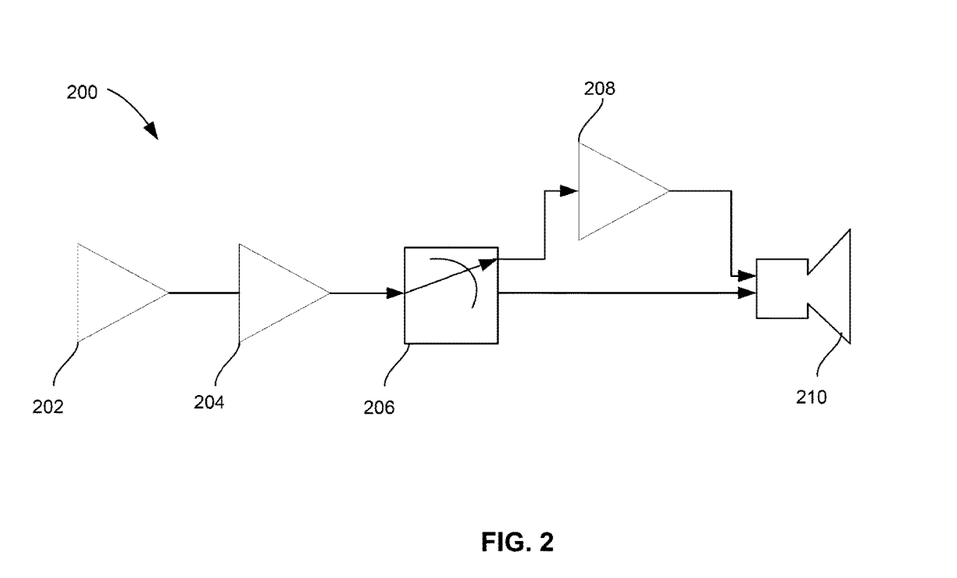
FIG. 2 is a circuit diagram according to aspects of the disclosure.

FIG. 2 illustrates an example circuit diagram calculating a smoothed background noise estimate and applying a volume gain to content prior to outputting the content. The process 200 may include determining the volume table 202 of the device, applying a speaker trim gain 204, determining whether the switch 206 is on or off, calculating a noise IQ gain 208 when the switch 206 is on, and outputting content 210 based on the calculated noise IQ gain 208.

The device may have an initial volume table 202. The volume table 202 may define a minimum volume level and a maximum volume level. Between the minimum and maximum volume level, the volume table 202 may define a number of volume steps and the loudness delta between each adjacent volume step. The loudness delta may be the difference between one volume level and an adjacent volume level. The device may also have a default loudness delta. In some instances, the loudness delta may be measured in decibels ("dB") or decibels of sound pressure level ("dB SPL").

A speaker trim gain 204 may be applied to the content. The speaker trim gain 204 may amplify the content. The trim gain may, according to some examples, be predetermined. The trim gain may ensure that the playback volume in each speaker match. For example, if the device is a pair of earbuds, the trim gain may adjust the playback volume of the left and/or right earbud such that the playback volume of the left and right earbud match.

According to some examples, a user may adjust settings on a user device to turn calculation of a noise IQ gain on or off. For example, adjusting the settings through a user interface, manual switch, gesture, voice command or the like may result in toggling switch 206. For example, if battery life is of concern, a user may switch off calculating a noise IQ gain, or parameters may be defined on the user device to automatically switch on or off the calculation of noise IQ gain when predetermined conditions are detected, such as battery level, etc. In examples where the switch 206 is turned off, the content is output to the user without further adjustment.

In examples where the switch 206 is turn on, a noise IQ gain 208 may be calculated. The noise IQ gain 208 may apply an additional level of volume gain based on the background noise level. In some examples, the noise IQ gain may apply a weight to either or both the background noise estimate and a previously calculated smoothed noise estimate. The previously calculated smoothed noise estimate may be a smoothed noise estimate calculated by the noise IQ gain 208 that occurred at a time "t−1", where "t" is the current time. Thus, applying a weight to either or both the background noise estimate and the previously calculated smoothed noise estimate may result in a present smoothed noise estimate being calculated.

An example of the equation applied by the noise IQ gain 208 is as follows:

$$\text{smoothed noise estimate}[t]=[\alpha*(\text{background noise estimate})]+[(1-\alpha)*(\text{smoothed noise estimate}[t-1])]$$

In the equation above, "t" may represent time and "α" may represent the weight factor. For ease of discussion herein, "smoothed noise estimate[t]" may be referred to as the "second smoothed noise estimate" and "smoothed noise estimate [t−1]" may be referred to as the "first smoothed noise estimate". The first smoothed noise estimate may occur at a time before the second smoothed noise estimate. Thus, the second smoothed noise estimate may be the more recent, temporarily, calculated smoothed noise estimate.

The equation may also be written as: $y(t)=\alpha x(t)+(1-\alpha)y(t-1)$.

The weight factor α applied to the background noise estimate and the first smoothed noise estimate may be a value between zero (0) and one (1). The weight applied may indicate how quickly the playback volume can adapt to the present background noise, or the new noise coming in. For example, if there is a quick transition from a quiet place, such as a library, to a loud place, such as the city streets, a larger weight may be used. In examples, where there is a slow transition, such as people slowly trickle in to a conference room, a smaller weight may be used.

The calculated second smoothed noise estimate may smooth out the volume gain to be applied by smoothing or slowing the average response to the background noise estimate based on the first smoothed noise estimate. By including the first smoothed noise estimate in the equation, the device may build a memory system such that the device does not react or adjust the playback volume level based only on the background noise level. In some examples, the noise IQ gain 208 may be continuously applied such that the device is continuously determining whether to adjust the volume gain, and therefore the playback volume, based on the background noise level.

The calculated second smoothed noise estimate may be used to determine a volume gain. The volume gain may be applied to increase or decrease the playback volume output 210 to the user.

According to some examples, the noise IQ gain may be calculating the smoothed noise estimate and/or the volume gain while the device is receiving content. This may allow for the content to buffer while the noise IQ gain is calculating the smoothed noise estimate and volume gain. Thus, the user may not experience any interruption in the output of content.

The noise IQ gain may be in any device that outputs content to a user. For example, the noise IQ gain may be applied in a smartphone, tablet, laptop, earbuds, headsets, glasses, VR googles, etc. The noise IQ gain may allow the device to respond to noise estimates in a given environment without receiving a user input. The smoothed noise estimate may provide a sine wave that allows for a smoothed or slow average response to the changes in the background noise estimates. The smoothed response allows for the device to apply a volume gain over time such that the user may not experience a sudden change in volume. Sudden changes in volume may be embarrassing, harmful to the user's hearing, unnecessary, frustrating, etc. Thus, the smoothed noise estimate may allow the device to calculate an appropriate volume gain to be applied to the playback volume over a certain period of time.

Figure 3:
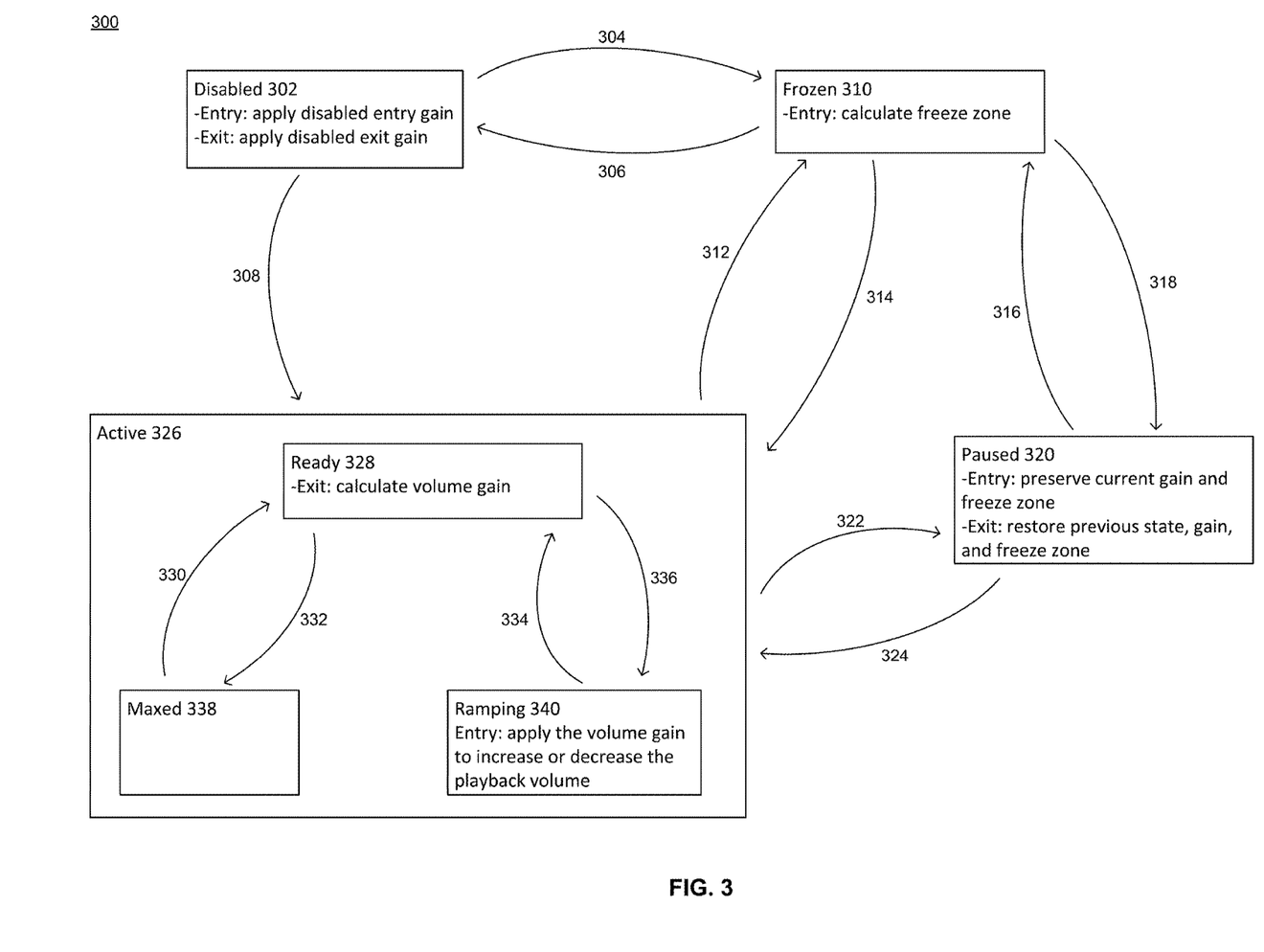
FIG. 3 is a state diagram according to aspects of the disclosure.

FIG. 3 illustrates a state diagram 300 illustrating various applications of the noise IQ gain. The device 100, using processor 102, may monitor the background noise estimate, store the first smoothed noise estimates, and monitor user inputs such as volume changes, playing or pausing content, etc. to move between the different states. The device 100 may handle each case systematically based on whether the device 100 is in a disabled state 302, frozen state 310, paused state 320, or active state 326.

When the device 100 is in the disabled state 302, calculating the second smoothed noise estimate may be suspended. The disabled state 302 may include a disabled entry gain and a disabled exit gain. The disabled entry gain may be a volume gain that occurs when the device 100 is in the disabled state 302. A disabled exit gain may be a volume gain when the device 100 leaves the disabled state 302. The value of the disabled entry gain may depend on the entry condition and the value of the disabled exit gain may depend on the exit condition.

The disabled entry gain may be applied based on an entry condition. According to some examples, when the playback volume of the device is set to zero or is muted, the disabled entry gain may turn or transition to zero. When the playback volume of the device is greater than a predetermined threshold "ZZ dB", the disabled entry gain may preserve the volume gain from the prior state, such as from the frozen state 310, paused state 320, or active state 326. The predetermined threshold ZZ dB may be the max noise IQ volume, or the volume at which the noise IQ gain is disabled. The predetermined threshold ZZ dB may be determined based on manufacturing specifications, user specifications or preferences, etc. In some examples, when the noise IQ gain is disabled, or switched off, the disabled entry gain may ramp down or transition to zero. In instances where an accessory, such as a pair of earbuds, is disconnected from a host device, such as a smartphone, the disabled entry gain may transition or turn to zero. In instances where the connection between the accessory and the host device is temporarily disconnected or dropped, the disabled entry gain may be preserved from the prior state.

The disabled exit gain may be applied based on an exit condition. For example, when the playback volume changes from zero, or muted, to a non-zero, or un-muted, playback volume, the disabled exit gain may be zero. In some examples, when the playback volume decreases to the predetermined threshold ZZ dB or less, the disabled exit gain may be preserved from the disabled state 302. Similar to the disabled entry gain, when the accessory is disconnected from the host device, the disabled exit gain may be zero. Additionally or alternatively, when the connection between the accessory and the host device is temporarily disconnected or dropped, the disabled entry gain may be preserved from the prior state.

The device 100 may transition from the disabled state 302 to the frozen state 310. For example, when the playback volume is greater than zero or is less than the predetermined threshold ZZ dB, the device 100 may transition 304 from the disabled state 302 to the frozen state 310.

In some examples, the device 100 may transition from the disabled state 302 to the active state 326. For example, when the noise IQ gain is turned on and there is content playing on the host device, the device 100 may transition 308 from the disabled state 302 to the active state 326.

When the device 100 is in the active state 326, the noise IQ gain may be calculating the second smoothed noise estimate based on the background noise estimate and the first smoothed noise estimate. The active state 326 may consist of three sub-states, including the ready state 328, maxed state 338, and the ramping state 340.

When the device 100 is in the ready state 328, the noise IQ gain may calculate the second smoothed noise estimate. The second smoothed noise estimate may be used to calculate a volume gain to be applied to the content. Based on the calculated volume gain, the device 100 may exit the ready state 328 and transition to either the maxed state 338 or ramping state 340.

For example, when the background noise estimate changes and results in a volume gain less than a predetermined threshold "YY dB", the device 100 may transition 336 from the ready state 328 to the ramping state 340. The predetermined threshold YY dB may be a maximum noise IQ gain or the maximum gain that may be applied to the playback volume. The ramping state 340 may apply the calculated volume gain to either increase or decrease the playback volume based on the second smoothed noise estimate. The playback volume may be adjusted over a calculated period of time such that the playback volume does not jump or drastically change. This may provide a better listening experience to the end user as the change in playback volume may not jolt the user. Once the volume gain is applied, the device 100 may transition 334 from the ramping state 340 back to the ready state 328.

In some examples, when the background noise estimate changes and results in a volume gain equal to or greater than the predetermined threshold YY dB, the device 100 may transition 332 from the ready state 328 to the maxed state 338. When the device 100 is in the maxed state 338, the maximum gain may have already been applied to the content and, therefore, there may be no changes to the current playback volume. In some examples, any additional increases in the second smooth noise estimate may not affect or change the state of device 100. The device 100 may re-smooth the background noise level, such that when the second smoothed noise estimate decreases by a certain amount "N dB", the device 100 may transition 330 from the maxed state 338 to the ready state 328.

The device 100 may transition from the active state 326 to the frozen state or the paused state 320. For example, when the device 100 receives an input to change the playback volume, the device 100 may transition 312 from the active state 326 to the frozen state 310. In some examples, when the device 100 receives an input to pause or stop the content, the device 100 may transition 322 from the active state 326 to the paused state 320.

When the device 100 is in the paused state 320, the content may no longer be playing or streaming on the host device. For example, if the content is music or a video that has sound, when the content is paused, there may not be any audio content being output by the host device. Thus, the device 100 may be in the paused state 320. When in the paused state 320, the paused entry gain may preserve the current volume gain and freeze zone, as described below. The paused exit gain may restore previous state, volume gain, and freeze zone.

The device 100 may transition from the paused state 320 to the active state 326 or the frozen state 310. For example, when content is resumed, the device 100 may transition 324 from the paused state 320 to the active state 326. In some examples, when content is resumed, the device 100 may transition 316 from the paused state 320 to the frozen state 310.

When the device 100 is in the frozen state 310 the noise IQ gain is frozen and the current volume gain may be preserved until the device 100 exits the frozen state 320. The device 100 may exit the frozen state 310 and transition to another state when the second smoothed noise estimate exits the freeze zone that was calculated upon entry to the frozen state 310.

For example, the freeze zone may be calculated based on the noise estimate, a parameter "X" defining the freeze zone limit, a mapped noise, and the adjusted volume. The noise estimate may be the previously calculated smoothed noise estimate. The mapped noise may be based on a noise threshold. The threshold may be, for example, the volume at which the NoiseIQ may start making volume gain adjustments to the playback volume. The parameter X may have a predefined or predetermined value that is used in calculating the freeze zone. In some examples, the parameter X may be determined by the manufacture, the user, etc. The parameter X may be changed and, therefore, the predetermined value may change. The adjusted volume may be the change in playback volume. The playback volume may increase or decrease based on one or more user inputs. Thus, the adjusted volume may be the difference between the playback volume before the device receives an input to adjust the playback volume and the playback volume after the device receives an input to adjust the playback volume.

An upper limit and a lower limit of the freeze zone may be calculated. For example, the lower limit may be calculated using the following example equation:

Lower limit, $L$=min(Noise estimate−$X$, MappedNoise (Adjusted Volume))

The upper limit may be calculated using the following example equation:

Upper limit, $U$=max(Noise estimate+$X$, MappedNoise(Adjusted Volume))

When the smoothed noise estimate calculated by the noise IQ gain falls outside of the upper and/or lower limit of the freeze zone, the device 100 may transition 314 from the frozen state 310 to the active state 326. In some examples, when the playback volume is equal to zero or is greater than the predetermined threshold ZZ dB, the device 100 may transition 306 from the frozen state 310 to the disabled state 302. Additionally or alternatively, when the device 100 receives an input to pause or stop the content, the device 100 may transition 318 from the frozen state 310 to the paused state 320.

Figure 4:
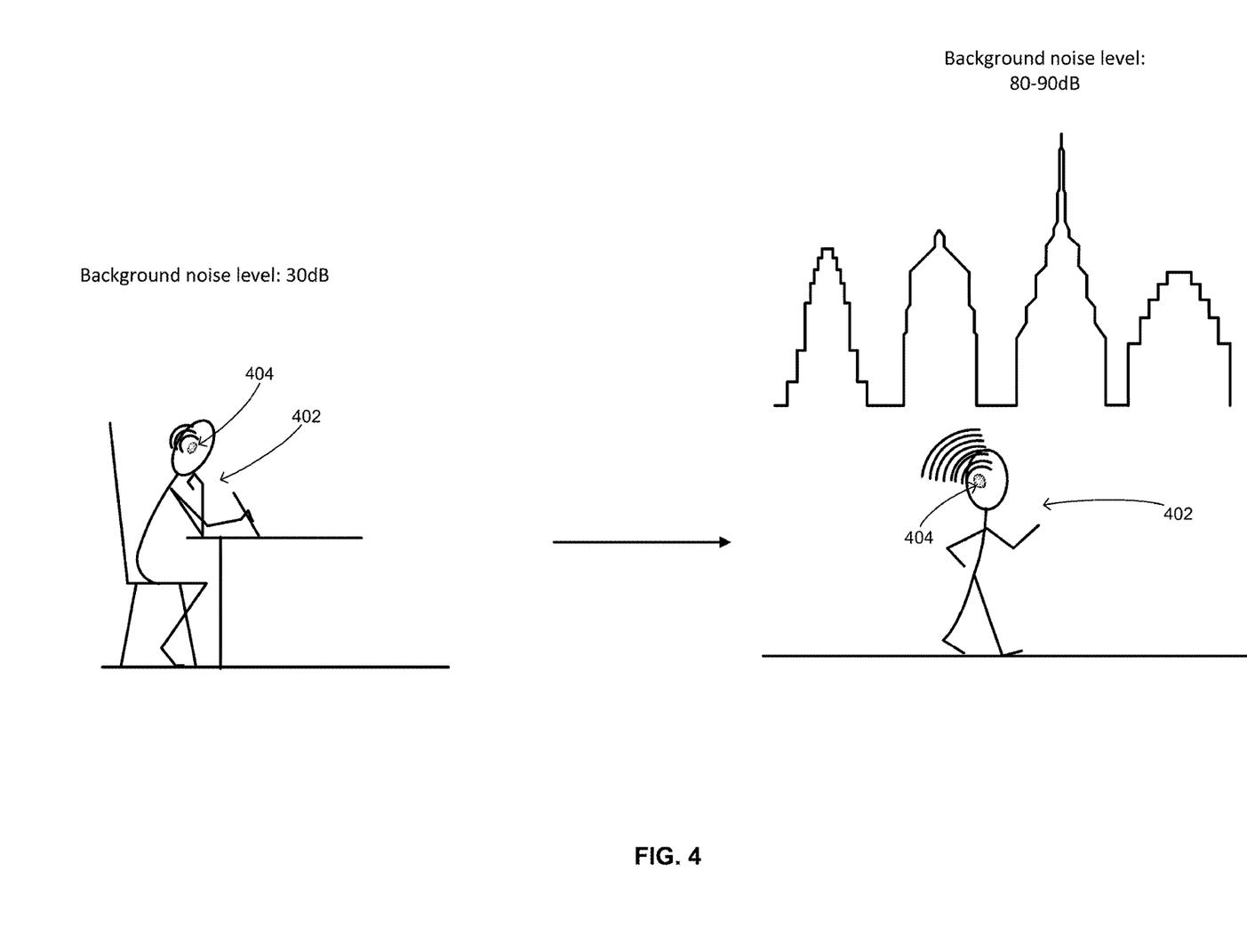
FIG. 4 is a pictorial diagram according to aspects of the disclosure.

FIG. 4 illustrates the dynamic adjustment of the playback volume level of a device when transitioning from a location with a decreased or relatively quiet background noise level to a location with an increased or relatively loud background noise level. For example, in a library the background noise level may be approximately 30 dB and in a city setting the background noise level may between 80-90 dB. The device may be a pair of earbuds, however, in some examples any of a variety of other devices may be used, such as augmented reality and/or virtual reality headsets, Bluetooth enabled headsets, glasses, head-mountable displays, smart watches, mobile phones and/or smart phones, tablets, music players, game consoles, motorcycle helmets, etc.

The device may detect that the environment is a quiet or loud environment based on the calculated second smoothed noise estimate. For example, the device may determine that the user is in a quiet environment when the calculated second smoothed noise estimate is between 25 dB-35 dB. In some examples, for the device to determine that the user is in a quiet environment, the calculated second smoothed noise estimate may be between 27.5 dB-32.5 dB. The device may determine that the user is in a loud environment when the calculated second smoothed noise estimate remains between 80 dB-90 dB, 87dB-92 dB, or 85 dB-95 dB. The ranges are merely a few examples and are not intended to be limiting. According to some examples, the calculated second smoothed noise estimate may remain within a certain range for a predetermined amount of time, such as two minutes, five minutes, eight minutes, etc. before the device determines that the user is in a quiet or loud environment.

The device may determine that the environment is something other than quiet or loud. For example, the device may detect the type of setting the user is in. In some examples, the settings may include office, city, home, café, etc. Each type of setting may have a different presented smoothed noise estimate threshold or range such that the device may adjust accordingly.

As described above, the noise IQ gain may use the present background noise estimate and the historical smoothed noise estimate to determine the second smoothed noise estimate. In a quiet environment, such as a library, the second smoothed noise estimate is unlikely to increase or decrease as the present background noise estimate may not change drastically over time. Additionally or accordingly, any changes in the background noise level in a quiet environment like a library is unlikely to be sustained and, therefore, may not be given much weight when calculating the present smoothed noise estimate. In a loud environment, such as the city, the second smoothed noise estimate may increase or decrease as the present background noise may change on each city block. The changes in background noise level in a loud environment may be sustained and, therefore, the present background noise estimate may be given more weight than the first smoothed noise estimate.

In examples where the device transitions from a quiet environment to a loud environment, the noise IQ gain may calculate a second smoothed noise estimate and apply a volume gain. When calculating the second smoothed noise estimate, the weight factor $\alpha$ may be change based on the type of environment, setting, and/or transition speed. For example, when the device is in a quiet environment and a sudden noise occurs, the weight factor $\alpha$ may be closer to zero (0) such that a greater weight is put on the first smoothed noise estimate as compared to the background noise estimate. By applying a greater weight to the first smoothed noise estimate, a small second smoothed noise estimate may be calculated and a small, if any, volume gain may occur. This may prevent any sudden changes in volume level that would embarrass the user in a quiet environment or hurt the user's hearing. When the device transitions from a quiet environment to a loud environment, the weight factor $\alpha$ may be closer to one (1) such that a greater weight is put on the background noise estimate as compared to the first smoothed noise estimate. This may result in a larger volume gain occurring over a shorter period of time such that the user does not lose any of the content being played back. In examples where the background noise levels may gradually change, the weight factor may be closer to zero (o) such that the second smoothed noise estimate slowly increases. The slow increase may prevent a large volume gain from being applied.

As shown in FIG. 4, user 402 may be in a quiet environment, such as a library, with a background noise level of approximately 30 dB. The user 402 may be wearing a device 404, such as earbuds, that output content. The playback volume may be relatively low. Additionally or alternatively, there may be little to no volume gain applied when user 402 is in the library as the background noise estimate may change very little over time. The calculated second smoothed noise estimate may, therefore, change very little over time. In examples, where there is little to no change of the second smoothed noise estimate, the device may determine that no volume gain is needed.

User 402 may leave or transition from the library to a loud environment, such as the city, with a background noise level of approximately 80-90 dB. The device 402 may detect that the change in environments and may quickly adapt to the new background noise level. For example, as background noise estimate quickly transitioned from 30 dB to between 80-90 dB, the background noise estimate may be weighted more than the first smoothed noise estimate. For example, the weight factor $\alpha$ may be a number closer to one (1) such that the newer data, the background noise estimate, is weighted more than the historical data, the first smoothed noise estimate. A volume gain may calculated based on the calculated second smoothed noise estimate. The calculated volume gain may be compared to a predetermined threshold. As described above with respect to FIG. 3, if the calculated volume gain is less than the predetermined threshold YY dB, the noise IQ gain may apply the volume gain to the content. As shown in FIG. 4, the volume gain may apply the volume gain to increase the playback volume of the content. The playback volume of device 404 may change without receiving an input from user 402.

The volume gain may increase the playback volume on device 404 over a certain period of time. In examples where the transition in background noise level is quick, the volume gain may be applied over a short period of time. Additionally or alternatively, in examples where there is a gradual change or transition in the background noise level, the volume gain may be applied over a longer period of time.

While FIG. 4 illustrates an example of the user transitioning from a quiet environment to a loud environment, the user may transition from a loud environment to a quiet environment. In such case, the volume gain may be a negative volume gain such that the playback volume decreases. The volume gain may be applied over a short period of time such that the playback volume decreases as the use enters the quiet environment. This may prevent the content from playing loudly in the user's ear in the quiet environment. This may also prevent any content from being overhead by nearby users, which may be embarrassing.

Figure 5:
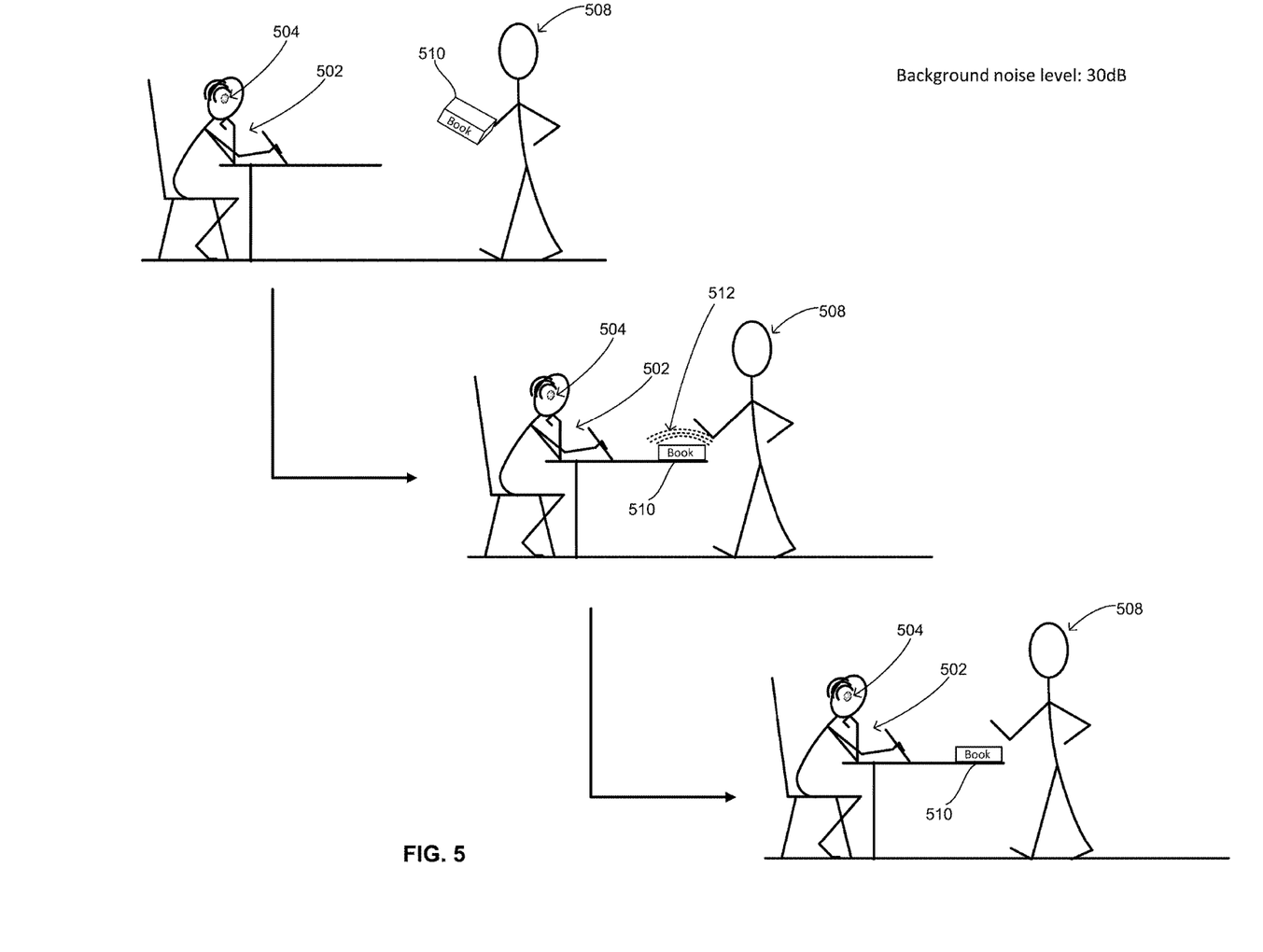
FIG. 5 is a pictorial diagram according to aspects of the disclosure.

FIG. 5 illustrates an example where a sudden noise occurs in an environment with a relatively stable or consistent background noise estimate. An environment with a relatively stable or consistent background noise estimate is an environment in which the calculated second smoothed noise estimate remains within a predetermined or specified range over a predetermined or specified period of time. When a sudden noise occurs in an environment that has had a stable background noise estimate, the noise IQ gain may calculate a second smooth noise estimate based on the background noise estimate and the first smoothed noise estimate. The background noise estimate may include the sudden noise. For example, the background noise estimate may include the background noise that occurred over a period of time, such as 3 seconds, 5 seconds, 10 seconds, etc. Thus, the sudden noise may be a peak in background noise levels during that period of time as compared to the consistent background noise volume during the remainder of the time. Based on the second smoothed noise estimate, the noise IQ gain may calculate or determine a volume gain. The volume gain may be minimal, if any, in an example where the environment has a stable or consistent background noise estimate even in instances where a loud or sudden noise occurs.

As shown in FIG. 5, user 502 may be wearing earbuds 504 in a quiet environment. For example, the quiet environment may be a library which may have a background noise level of 30 dB. The earbuds 504 may have a playback volume level that is appropriate for user 502 to hear the content but may not be loud enough for others to hear the content.

User 508 may be approaching user 502 with a book 510. User 508 may drop the book 510 on the desk user 502 is working at. According to some examples, dropping book 510 on the desk may make a loud, sudden noise 512. Noise 512 may be considered by the noise IQ gain when calculating the second background noise estimate. However, as noise 512 is sudden and not a long lasting sound, noise 512 may skew the background noise estimate to be higher than necessary. For example, the background noise estimate may look at the average background noise over a period of time. The noise 512 may be a spike in the background noise volume during that period of time, thereby increasing the background noise estimate.

After book 510 has been dropped, the background noise level may return to the estimated 30 dB, such that applying a volume gain based on noise 512 may be inconvenient, embarrassing, fruitless, etc. In examples where the background noise level returns to the stable or consistent background noise level, the noise IQ gain may weight or emphasize the first smoothed noise estimate more than the background noise estimate. In such an example, the first smoothed noise estimate may be weighted more than the background noise estimate because the device determined that it was a quiet environment with a consistent background noise level. Thus, the device may determine that the temporary increase in the background noise estimate is an anomaly and, therefore, should be given less weight than the first smoothed noise estimate. To do so, the weight factor $\alpha$ may be closer to zero (0) than one (1).

The noise IQ gain may calculate a first smoothed noise estimate. The second smoothed noise estimate may be used to calculate a volume gain. The volume gain may be minimal, if any, as there may be little to no change between the second smoothed noise estimate and the first smoothed noise estimate.

Figure 6:
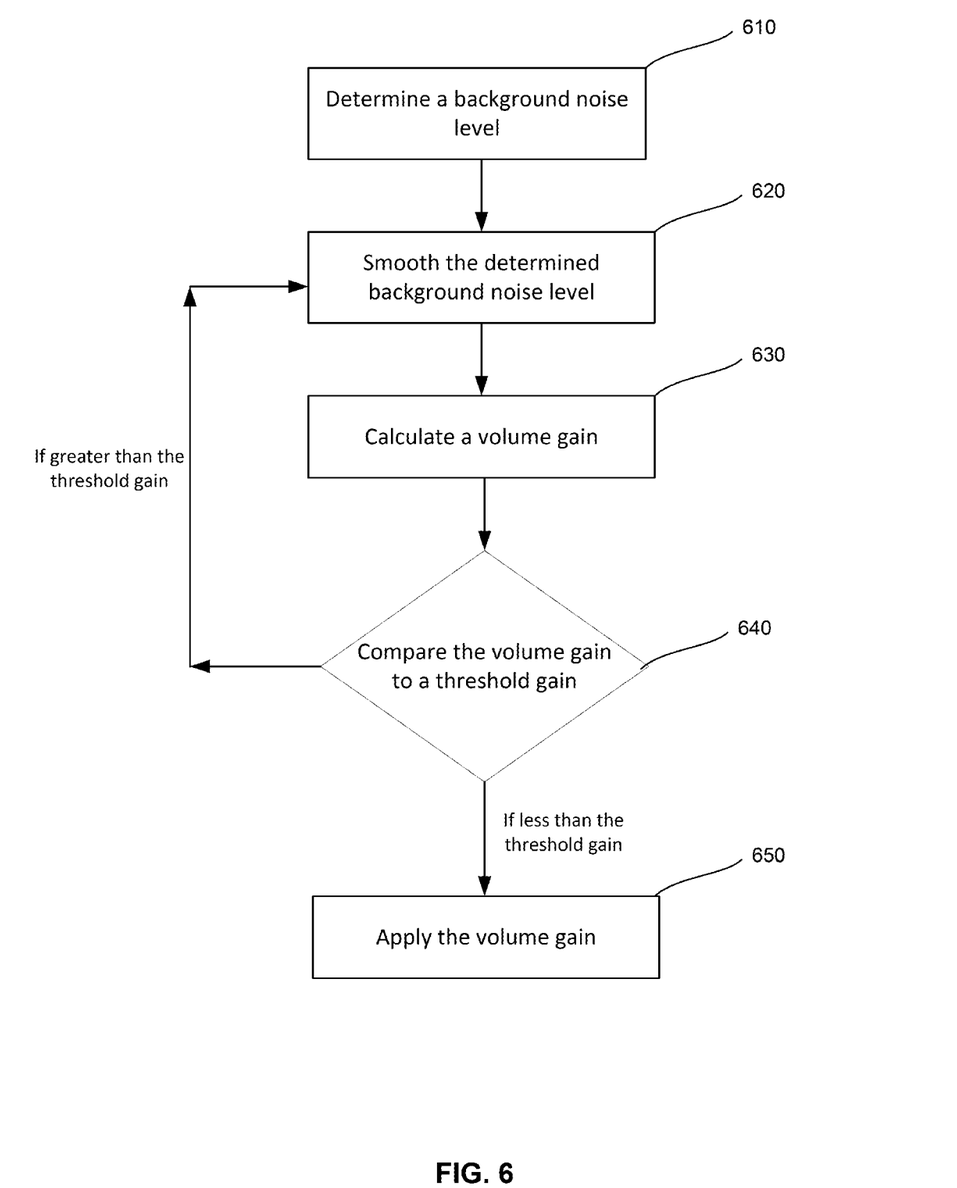
FIG. 6 is a flow diagram illustrating an example method in accordance with aspects of the disclosure.

FIG. 6 illustrates a sequence of steps that may occur when the device dynamically calculates a smoothed noise estimate to apply a volume gain. For example, in block 610, the device may determine a background noise level. The background noise level may be taken over a period of time, such as two (2) seconds, five (5) seconds, eight (8) seconds, etc. The period of time may be predetermined by the manufacturer or selected by a user.

In block 620, the determined background noise level may be smoothed by a noise IQ gain. For example, the noise IQ gain may apply a weight factor to the determined background noise level and the first smoothed noise estimate to determine a second smoothed noise estimate. Depending on the type of environment, the sustainability of the background noise, etc. the weight factor may be closer to zero (0) or one (1). For example, when there is a quick transition between background noise levels, such as leaving a quiet environment to enter a loud environment, the weight factor may be closer to one (1) such that the determined background noise is weighted more heavily than the first smoothed noise estimate. Additionally or alternatively, when there is a slow transition between background noise levels, such as people slowly coming into a room for a meeting, the weight factor may be closer to zero (0) such that the first smoothed noise estimate is weighted more heavily than the determined background noise level.

In block 630, the smoothed background noise level, or the second smoothed noise estimate, may be used to calculate a volume gain. The volume gain may be positive or negative, such that a positive volume gain may increase the playback volume and a negative volume gain may decrease the playback volume.

In block 640, the calculated volume gain may be compared to a threshold gain. The threshold gain may be a maximum noise IQ gain or a maximum gain that may be applied to the playback volume. In examples where the calculated volume gain is less than the threshold gain, the device may proceed to block 650. In examples where the calculated volume gain is greater than the threshold gain, the device may return to block 620.

In block 650, the device may apply the calculated volume gain to increase or decrease the playback volume.

The process illustrated in FIG. 6 may be a repetitive process. For example, the process may repeat itself after a configurable period. In some examples, the process may repeat itself every two, five, ten, eighteen, twenty-two, etc. seconds. According to some examples, the process may repeat itself every one, three, seven, twelve, etc. minutes. Thus, the configurable period may be any preset period of time. Additionally or alternatively, the period at which the process repeats itself may be changed based on user preferences, battery life of the device, etc.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A device, comprising:
one or more microphones; and
one or more processors in communication with the one or more microphones, the one or more processors being configured to determine a state of the device and, respondent to the determined state of the device being an active state:
determine a background noise level;
smooth the determined background noise level by applying a weight factor to the determined background noise level;
calculate, based on the smoothed noise level, a volume gain;
compare the calculated volume gain to a threshold gain; and
apply the calculated volume gain to increase or decrease a playback volume of the device when the calculated volume gain is less than the threshold gain.

2. The device of claim 1, wherein when the calculated volume gain is equal to the threshold gain the one or more processors are further configured to re-smooth the background noise level.

3. The device of claim 1, wherein the weight factor corresponds to a change in intensity of background noise.

4. The device of claim 1, wherein the weight factor is larger for a first transition from a first background noise level to a second background noise level than a second transition from a third background noise level to a fourth background noise level, the first transition being quicker than the second transition.

5. The device of claim 1, wherein smoothing the determined background noise further includes applying the weight factor to a second smoothed noise level.

6. The device of claim 5, wherein the smoothed noise level is calculated at a first time and the second smoothed noise level is calculated at a second time, the second time occurring before the first time.

7. The device of claim 1, wherein the one or more processors are further configured to, respondent to the determined state of the device being an active state:
receive an input for adjusting the playback volume, wherein the input differs from the calculated volume gain; and
adjust the playback volume based on the received input.

8. The device of claim 1, wherein applying the volume gain occurs over a period of time such that the playback volume gradually increases or decreases.

9. A method, comprising determining, using one or more processors, a state of a device and, respondent to the determined state of the device being an active state:
determining, using the one or more processors, a background noise level;
smoothing, using the one or more processors, the determined background noise level by applying a weight factor to the determined background noise level;
calculating, using the one or more processors based on the smoothed noise level, a volume gain;
comparing, using the one or more processors, the calculated volume gain to a threshold gain; and
applying, using the one or more processors, the calculated volume gain to increase or decrease a playback volume of the device when the calculated volume gain is less than the threshold gain.

10. The method of claim 9, further comprising, respondent to the determined state of the device being an active state, re-smoothing, using the one or more processors, the background noise level when the calculated volume gain is equal to the threshold gain.

11. The method of claim 9, wherein the weight factor corresponds to a change in intensity of background noise.

12. The method of claim 9, wherein the weight factor is larger for a first transition from a first background noise level to a second background noise level than a second transition from a third background noise level to a fourth background noise level, the first transition being quicker than the second transition.

13. The method of claim 9, wherein smoothing the determined background noise further includes applying, using the one or more processors, the weight factor to a second smoothed noise level.

14. The method of claim 13, wherein the smoothed noise level is calculated at a first time and the second smoothed noise level is calculated at a second time, the second time occurring before the first time.

15. The method of claim 9, further comprising, respondent to the determined state of the device being an active state:
receiving an input for adjusting the playback volume, wherein the input differs from the calculated volume gain; and
adjusting the playback volume based on the received input-.

16. The method of claim 9, further comprising, respondent to the determined state of the device being an active state, receiving content such that smoothing the determined background noise level and calculating the volume gain occur when the device is receiving the content.

17. A non-transitory computer-readable medium storing instructions, which when executed by one or more processors cause the one or more processors to determine a state of a device and, respondent to the determined state of the device being an active state:

determine a background noise level;

smooth the determined background noise level by applying a weight factor to the determined background noise level;

calculate, based on the smoothed noise level, a volume gain;

compare the calculated volume gain to a threshold gain; and apply the calculated volume gain to increase or decrease a playback volume of the device when the calculated volume gain is less than the threshold gain.

18. The non-transitory computer-readable medium of claim 17, wherein the weight factor corresponds to a change in intensity of background noise such that the weight factor is larger for a first transition from a first background noise level to a second background noise level than a second transition from a third background noise level to a fourth background noise level, the first transition being quicker than the second transition.

19. The device of claim 1, wherein:

the state of the device is one of an active state, a frozen state, a paused state, or a disabled state, wherein at least the active state comprises a plurality of substates; and the one or more processors are further configured to move the device between the states based on at least one of a user input, a playback status of an audio content, the playback volume of the device, or a connection status between the device and another device.

20. The device of claim 1, wherein:

the one or more processors are further configured output an audio content; and the determination of the device being in the active state comprises at least in part a determination that the audio content is being output by the one or more processors.

* * * * *

UNITED STATES PATENT AND TRADEMARK OFFICE
CERTIFICATE OF CORRECTION

| | |
|---|---|
| PATENT NO. | : 11,934,737 B2 |
| APPLICATION NO. | : 17/282234 |
| DATED | : March 19, 2024 |
| INVENTOR(S) | : Jae Lee and Manas Maheshwari |

It is certified that error appears in the above-identified patent and that said Letters Patent is hereby corrected as shown below:

In the Claims

Column 14, Lines 56-57: After "received", delete "input-." add --input.--

Signed and Sealed this
Fifteenth Day of October, 2024

Katherine Kelly Vidal
*Director of the United States Patent and Trademark Office*